United States Patent [19]

Son

[11] Patent Number: 5,469,080
[45] Date of Patent: Nov. 21, 1995

[54] LOW-POWER, LOGIC SIGNAL LEVEL CONVERTER

[75] Inventor: Ilhun Son, Palo Alto, Calif.

[73] Assignee: Sun Microsytems, Inc., Mountain View, Calif.

[21] Appl. No.: 283,272

[22] Filed: Jul. 29, 1994

[51] Int. Cl.⁶ .................................. H03K 19/0185
[52] U.S. Cl. ................... 326/81; 326/71; 326/83
[58] Field of Search .................. 326/58, 71, 80, 326/83, 115, 81; 327/53, 534

[56] References Cited

U.S. PATENT DOCUMENTS

| | | | |
|---|---|---|---|
| 4,656,374 | 4/1987 | Rapp | 326/71 |
| 4,825,110 | 4/1989 | Yamaguchi et al. | 326/24 |
| 4,845,381 | 7/1989 | Cuevas | 326/81 |
| 5,019,729 | 5/1991 | Kimura et al. | 326/71 |
| 5,202,594 | 4/1993 | Chang | 326/73 |
| 5,266,849 | 11/1993 | Kitahara et al. | 326/58 |

*Primary Examiner*—Edward P. Westin
*Assistant Examiner*—Benjamin D. Driscoll
*Attorney, Agent, or Firm*—Limbach & Limbach

[57] ABSTRACT

A low-power, logic signal level converter includes a CMOSFET current mirror differential amplifier with a current control element for providing a level-converted output logic signal in response to an input logic signal while ensuring that virtually no DC current is drawn during steady-state circuit operations. The CMOSFET current mirror differential amplifier includes a PMOSFET current mirror driven by NMOSFET pull-down transistors with a DC current-blocking PMOSFET between them. The interposed PMOSFET blocks DC current flow during steady-state circuit operation without adversely affecting the line driving capacity of the current mirror differential amplifier during logic signal transitions.

24 Claims, 5 Drawing Sheets

LOW-POWER, LOGIC SIGNAL LEVEL CONVERTER

BACKGROUND OF THE INVENTION

1. Field of Invention

The present invention relates to digital signal interfaces, and in particular, to a low-power, logic signal level converter capable of receiving a logic signal from a circuit operating at a low power supply voltage and converting such signal to an output with a higher peak-to-peak signal swing for driving a system bus referenced to a higher power supply voltage.

2. Description of the Related Art

With the increasing density of very large scale integration (VLSI) circuits, corresponding increases in power requirements and dissipation have become of increasing concern. Larger power supplies become necessary, as well as more sophisticated heat sinking techniques, both of which add cost, complexity and weight to a system. Furthermore, increasingly dense VLSI circuits have allowed systems to be developed which are significantly smaller, and yet significantly more powerful, than their recent predecessors. This, in turn, allows such systems to become increasingly portable. However, such portability can be limited in the face of higher power requirements and dissipation. For example, in portable applications larger or more numerous batteries become necessary.

One technique which has been used with some success to address the power requirements of VLSI circuits while still allowing for a reasonable degree of portability has been the development of low voltage VLSI circuits. Many circuits have been developed which can operate at lower power, with lower power supply voltages. However, the need often arises for interfacing such low voltage systems to higher voltage systems, such as hard-wired connections to networks, computers or workstations. Accordingly, such low voltage systems require interfaces capable of converting their input and output signals, while still seeking to minimize power dissipation.

In such interfaces, the greater challenge is in realizing an output signal converter, e.g. a line driver capable of receiving a low voltage input logic signal and driving a signal bus line with a higher voltage logic signal. Conventional converter designs have required the use of multiple stages of buffering. (See e.g. A. Chandrakasan, A. Burstein and R. W. Brodersen, "A Low Power Chipset for Portable Multimedia Applications", ISSCC Digest of Technical Papers, February 1994, pp. 82–83.) However, this technique results in greater circuit complexity, higher power consumption and output signal delay.

Accordingly, it would be desirable to have a logic signal level converter capable of converting low voltage logic signals to higher voltage logic signals without introducing additional circuit complexity while minimizing signal delay and power consumption.

SUMMARY OF THE INVENTION

A low-power, logic signal level converter in accordance with the present invention provides conversion of logic signals from low voltage systems to logic signals for higher voltage systems without the need for additional signal buffer amplifiers and with virtually no DC power consumption during steady-state circuit operations, thereby minimizing circuit complexity, output signal delay and power consumption.

A low-power, logic signal level converter in accordance with the present invention includes two driver circuits and a current control circuit. Each driver circuit includes two transistors and is coupled to an output node, with one driver circuit for receiving a binary input logic signal, the other driver circuit for coupling to a power supply and the two driver circuits for cooperatively providing an output logic signal at the output node in response to the input logic signal. In the first driver circuit, one transistor is turned on and off while the other transistor is turned off and on, respectively, in response to the binary input logic signal. In the second driver circuit, current is selectively conducted from the power supply and one transistor is turned on during the on-to-off transition of one of the transistors in the first driver circuit. The current control circuit, also coupled to the output node as well as the two driver circuits, includes a transistor for selectively conducting the power supply current via the second driver circuit to the first driver circuit, with such transistor being turned on and off in response to the on and off states of the aforementioned transistor in the first driver circuit.

In one embodiment of the present invention, the low-power, logic signal level converter includes a CMOSFET current mirror differential amplifier with a current control element for providing a level-converted output logic signal in response to an input logic signal while drawing virtually no DC current during steady-state circuit conditions. The CMOSFET current mirror differential amplifier includes a PMOSFET current mirror (as the second driver circuit) driven by NMOSFET pull-down transistors (as the first driver circuit) with a PMOSFET coupled between them. The interposed PMOSFET (as the current control circuit) blocks DC current flow during steady-state circuit operation without adversely affecting the line driving capacity of the current mirror differential amplifier during logic signal transitions.

These and other features and advantages of the present invention will be understood upon consideration of the following detailed description of the invention and the accompanying drawings.

BRIEF DESCRIPTIONS OF THE DRAWINGS

DETAILED DESCRIPTION OF THE INVENTION

Figure 1:
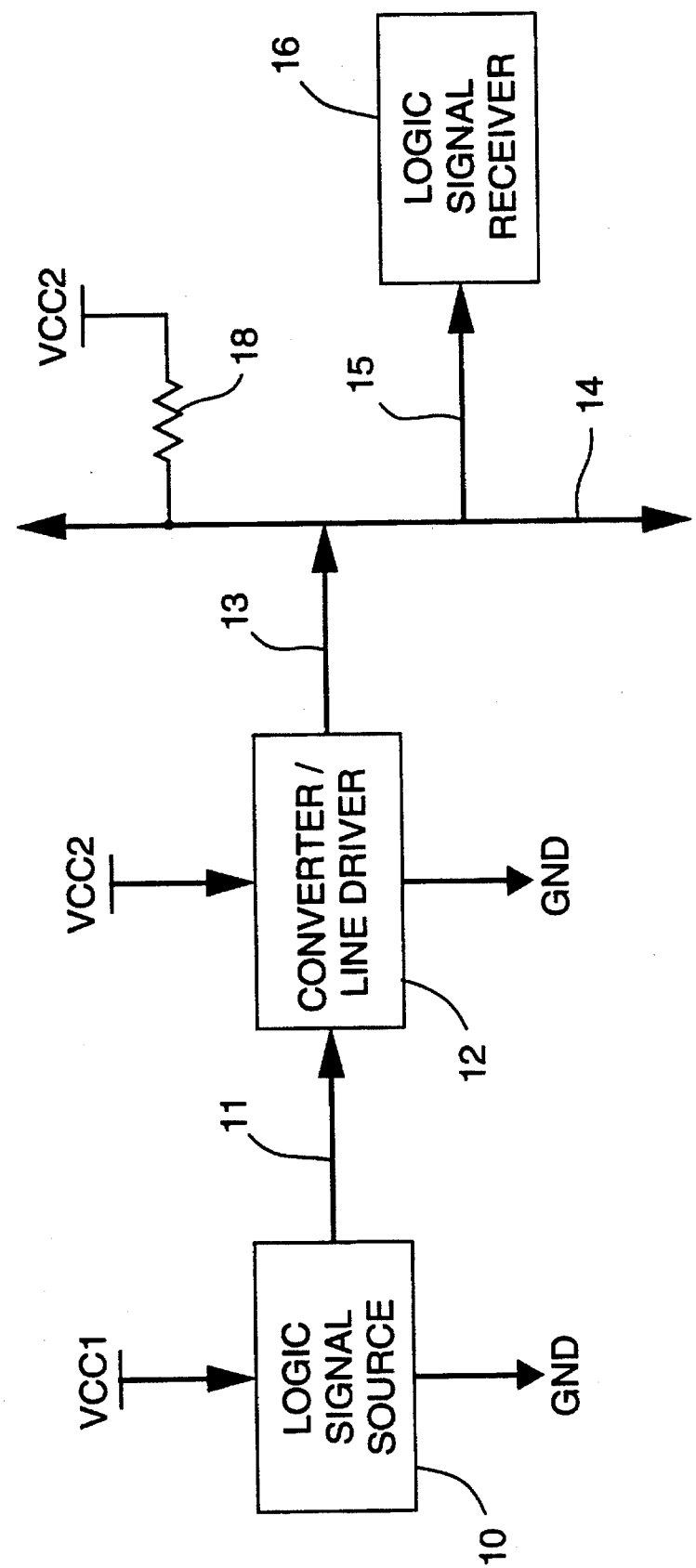
FIG. 1 illustrates, in functional block diagram form, a system application for a low-power, logic signal level converter in accordance with the present invention.

Referring to FIG. 1, a system application for a low-power, logic signal level converter in accordance with the present invention includes a logic signal source 10, a converter (sometimes referred to as a line driver) 12, signal bus line 14 and a logic signal receiver 16. The logic signal source 10 is powered by a low voltage power supply Vcc1 and provides a logic signal 11 to the converter 12. The converter 12 is powered by a higher voltage power supply Vcc2 and converts the input logic signal 11 to a higher voltage output logic signal 13 to drive the signal bus line 14. The signal bus line 14 is referenced to the higher voltage power supply Vcc2 as well, e.g. through a resistive pullup 18, and conducts the converted signal 13 to the remainder of the system. The logic signal receiver 16 receives the converted signal 15 conveyed by the signal bus line 14.

The low voltage power supply Vcc1 (e.g. 3.3 volts) causes the logic signal 11 provided by the logic signal source to have a low logic level difference, i.e. a low peak-to-peak or rail-to-rail signal swing. The converter 12 (discussed further below), powered by its higher power supply voltage Vcc2, increases this logic level difference to produce its output signal 13 with a higher logic level difference, or peak-to-peak signal swing.

It should be appreciated that the functional elements 10, 12, 14, 16 of FIG. 1 represent basic functional elements of virtually any logic system. For example, the logic signal source 10, converter 12, signal bus line 14 and logic signal receiver 16 can all reside in a single integrated circuit (IC), such as a microprocessor or controller. Alternatively, the logic signal source 10 and converter 12 can reside in one single IC which interfaces by way of the signal bus line 14 to other ICs, such as one containing a logic signal receiver 16. Further alternatively, the logic signal source 10 can be in a system distinct from that containing the converter 12 with the converter 12 providing an input interface for the output signal 11 from the logic signal source 10. Accordingly, the logic signal source 10 can be virtually any form of logic signal generator, including circuits ranging from those as simple as a logic gate to those as complex as a microprocessor. Similarly, the logic signal receiver 16 can be virtually any form of circuit capable of receiving a logic signal, including logic gates, microprocessors, etc.

Figure 2A:
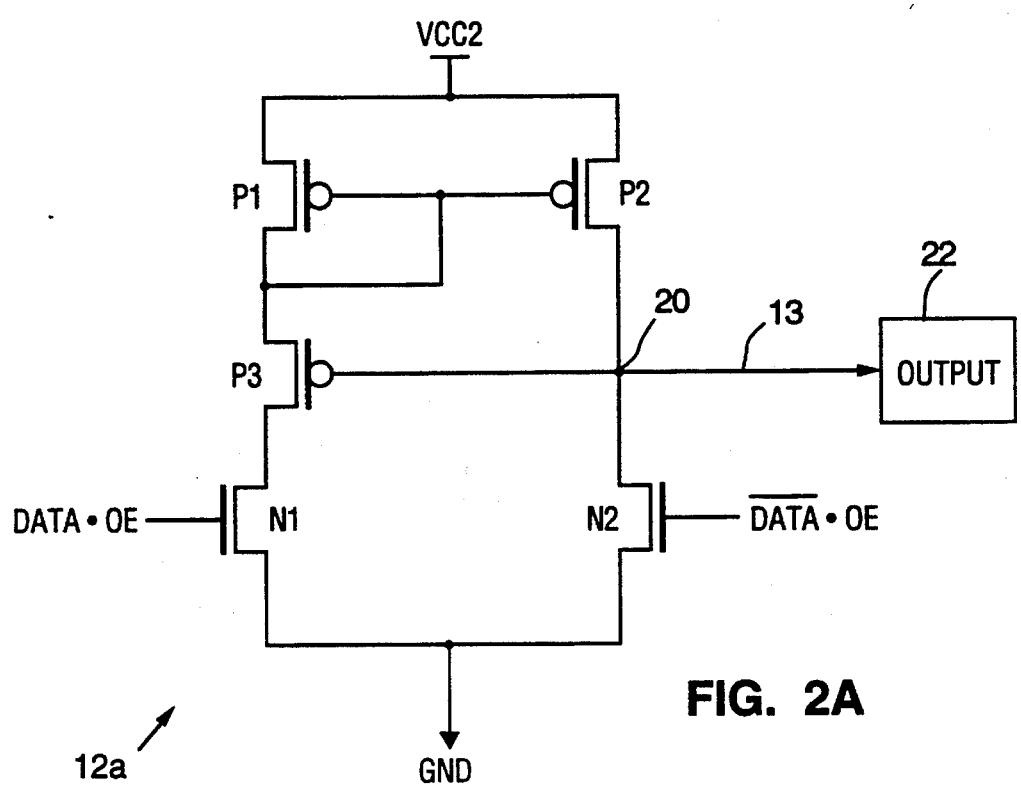
FIG. 2A is a schematic diagram of a low-power, logic signal level converter circuit in accordance with one embodiment of the present invention.

Referring to FIG. 2A, a low-power, logic signal level converter 12a in accordance with one embodiment of the present invention includes a specially designed complementary metal oxide semiconductor field effect transistor (CMOSFET) current mirror differential amplifier which includes a PMOSFET current mirror (PMOSFETs P1 and P2) and NMOSFET pull-down transistors (NMOSFETs N1 and N2) with a PMOSFET (P3) coupled in between. The sources of PMOSFETs P1 and P2 are connected to the power supply voltage Vcc2, while the sources of NMOSFETs N1 and N2 are connected to circuit ground GND. Transistors N1, P1 and P3 are totem-pole-coupled together, with the drains of NMOSFET N1 and PMOSFET P3 connected together and the source of PMOSFET P3 connected to the drain and gate of PMOSFET P1 and gate of PMOSFET P2. Transistors N2 and P2 are also totem-pole-coupled together at the output node 20 and gate of PMOSFET P3, The output node 20, particularly in the context of an IC version of the converter 12a, is typically connected to an output pad 22 for interfacing with the outside, e.g. a signal bus line 14 (FIG. 1).

Figure 3:
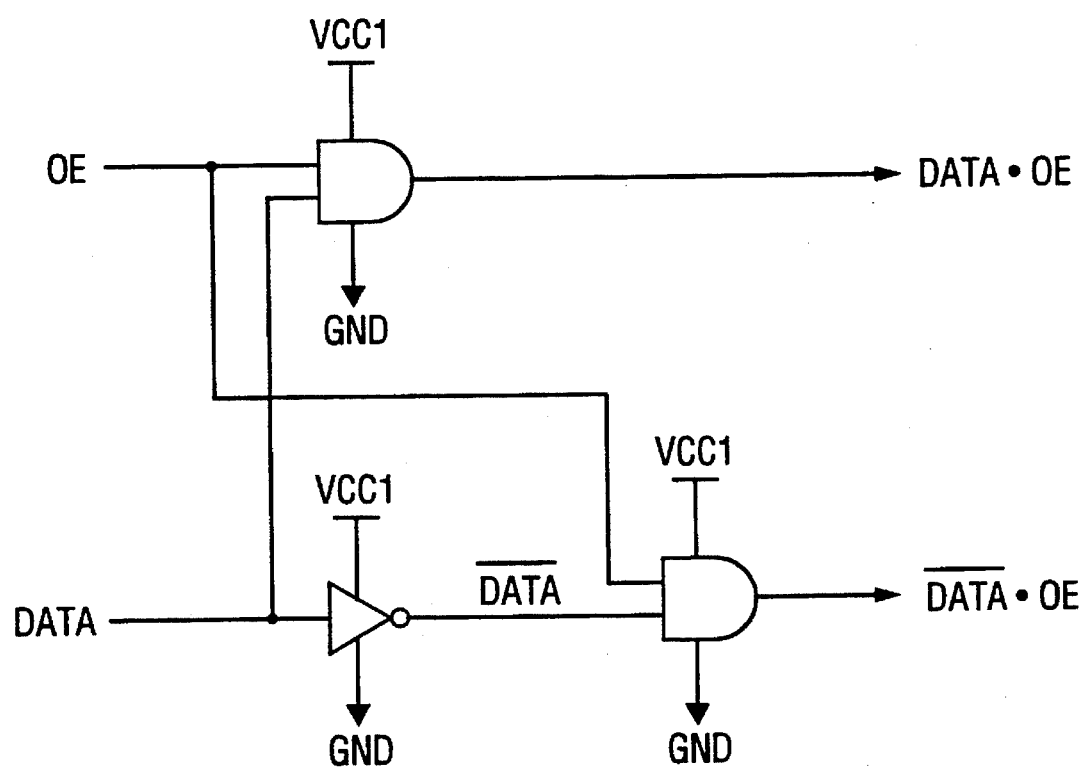
FIG. 3 is a logic diagram of a signal conversion and enablement circuit for providing the input signal for the circuit of FIG. 2A.

The NMOSFET pull-down transistors receive a complementary input logic signal DATA·OE, $\overline{DATA·OE}$, which is a data signal referenced to a low voltage power supply Vcc1 and selectively enabled and disabled with an output enabling signal OE. (Referring to FIG. 3, such a complementary signal can be generated using two AND gates and an inverter, as shown.) When the output enabling signal OE is low, both transistors N1 and N2 are turned off. This results in the gate voltage of transistor P2 being pulled up to Vcc2-Vth,p by transistor P1, thereby turning off transistor P2 (where Vth,p is the PMOSFET threshold voltage). When the output enabling signal OE is high, the complementary input logic signal DATA·OE, $\overline{DATA·OE}$ becomes active with one of the input gate voltages of transistors N1 and N2 rising to approximately Vcc1 or falling to GND, where Vcc1 is the power supply voltage for the circuit providing the complementary input logic signal DATA·OE, $\overline{DATA·OE}$ (see e.g. FIG. 3).

When DATA becomes high, transistor N1 is turned on and transistor N2 is turned off. Transistor P3 is initially turned on due to the voltage at the output node 20 being at a low level. Therefore, the gate voltage of transistor P2 is pulled low. This results in the output signal 13 voltage being pulled toward Vcc2 since transistor N2 is turned off ($\overline{DATA·OE}$ is low) and transistor P2 is turned on. Once the output signal 13 voltage reaches Vcc2-Vth,p, transistor P3 is turned off and the gate voltage of transistor P2 is pulled up to Vcc2-Vth,p by transistor P1. Transistor P2 remains off as long as the output signal 13 voltage is equal to or greater than Vcc2-Vth,p.

When DATA becomes low, transistor N2 is turned on and transistor N1 is turned off. As the output voltage goes low, transistor P3 is turned on. However, the gate voltage of transistor P2 remains high since transistor N1 is turned off.

Figure 2B:
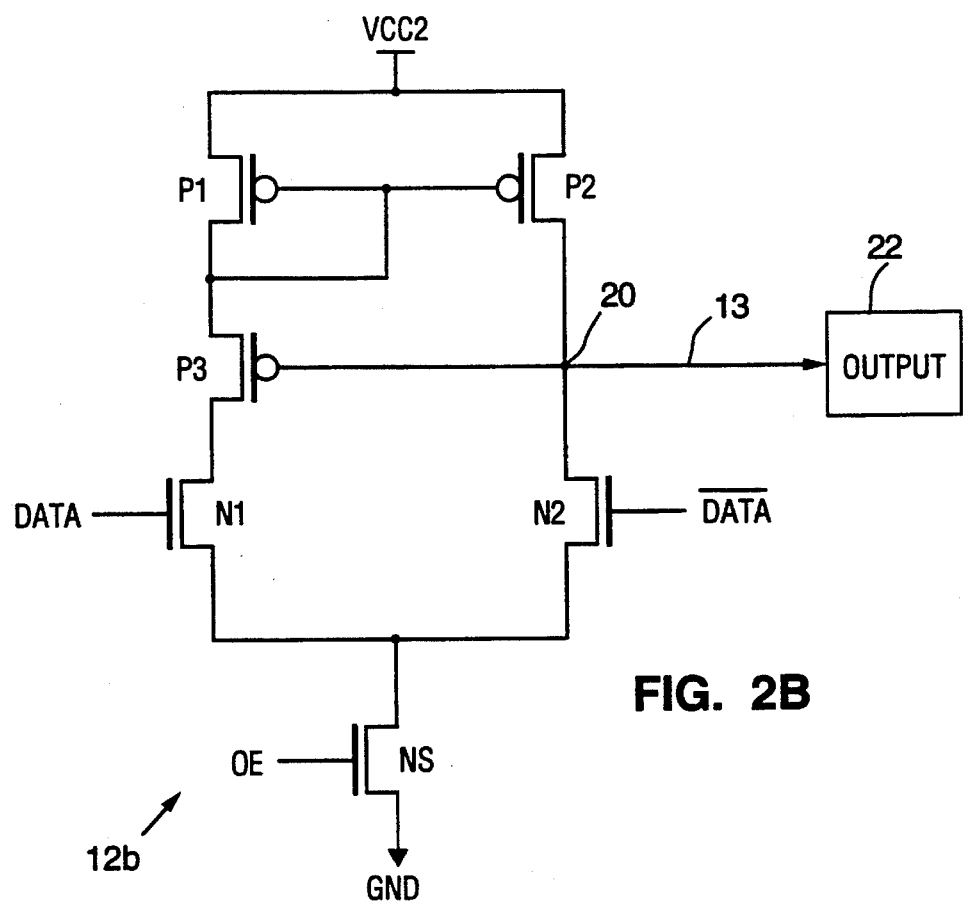
FIG. 2B is a schematic diagram of a low-power, logic signal level converter circuit in accordance with another embodiment of the present invention.

Referring to FIG. 2B, a low-power, logic signal level converter 12b in accordance with another embodiment of the present invention includes a CMOSFET current mirror differential amplifier similar to that shown in FIG. 2A, with the addition of NMOSFET NS, connected as shown. The operation of this converter 12b is similar to that of the converter 12a of FIG. 2A. However, enablement of the circuit operation can be done with one transistor (NMOSFET NS), thereby avoiding the need for more complicated enabling circuits (such as that shown in FIG. 3). This converter 12b can be used to simplify the generation of the complementary input logic signal DATA·OE, $\overline{DATA·OE}$ when output loading, i.e. of the output pad 22, is light.

Figure 4:
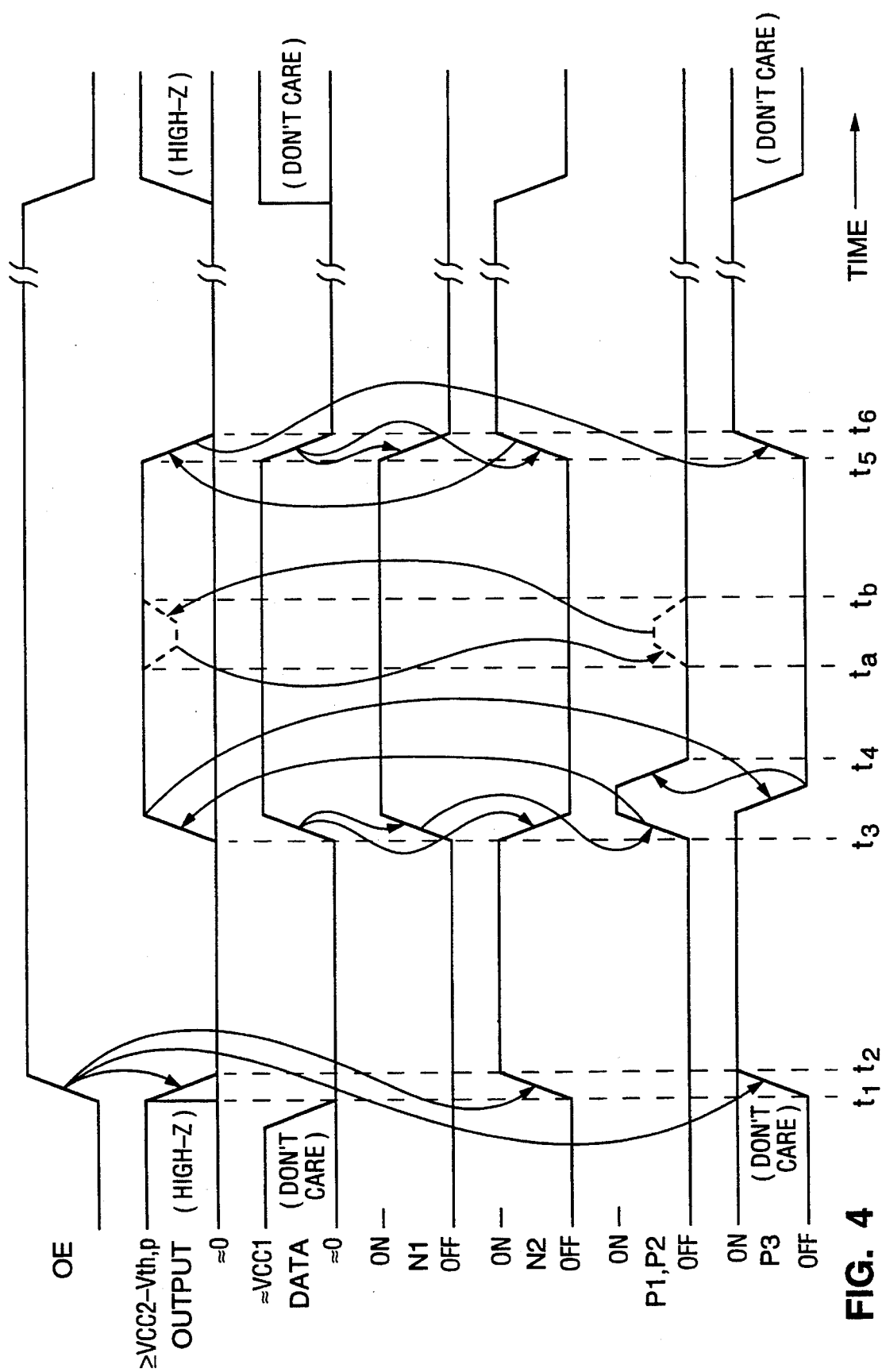
FIG. 4 is a timing diagram illustrating the timing relationships of various signals and the conduction states of various transistors in the circuit of FIGS. 2A and 2B.

Referring to FIG. 4, the timing of the above-discussed signal states and transistor conduction states can be better understood. Prior to time t1, the output enabling signal OE is low. Therefore, the output node 20 (and pad 22) is in a high impedance state and the states of the data signal DATA and conduction state of transistor P3 are of no concern.

During time interval t1–t2, the output enabling signal OE rises to a logical high state. With the data signal DATA in a low state, the output (13) goes low while transistors N2 and P3 turn on. Transistor N1, which was already turned off, remains off.

During time interval t3–t4, when DATA goes high, transistors P2 and N1 turn on while transistor N2 turns off. This causes the output (13) to go high, which in turn causes transistor P3 to turn off. As transistor P3 turns off, transistor P2 also turns off. Transistor P2 remains off as long as the output (13) stays high, i.e. at Vcc2-Vth,p. However, if the output (13) drops below this level, transistor P2 will become conductive as necessary to cause the output (13) to return to this level. For example, if during time interval ta–tb the output (13) drops, transistor P2 will become conductive to help bring the output (13) back to the desired level of Vcc2-Vth,p.

During time interval t5–t6, when DATA goes low, transistor N1 turns off and transistor N2 turns on. This results in the output (13) going low, which in turn causes transistor P3 to turn on.

As should be understood from the foregoing, transistors P2 and N2 actually drive the output node 20, i.e. transistor P2 provides the drive capacity for the low-to-high transitions of the output signal 13 voltage, while transistor N2 provides the drive for the high-to-low transitions. Therefore, the device sizes of transistors N1, P1 and P3 can be smaller, e.g. by half or less, than transistors N2 and P2. Meanwhile, transistor P3 prevents conduction of DC current from the power supply Vcc2 via transistor P1 to transistor N1 during steady-state operation of the converter circuit 12a (FIGS. 2A and 2B).

Figure 5:
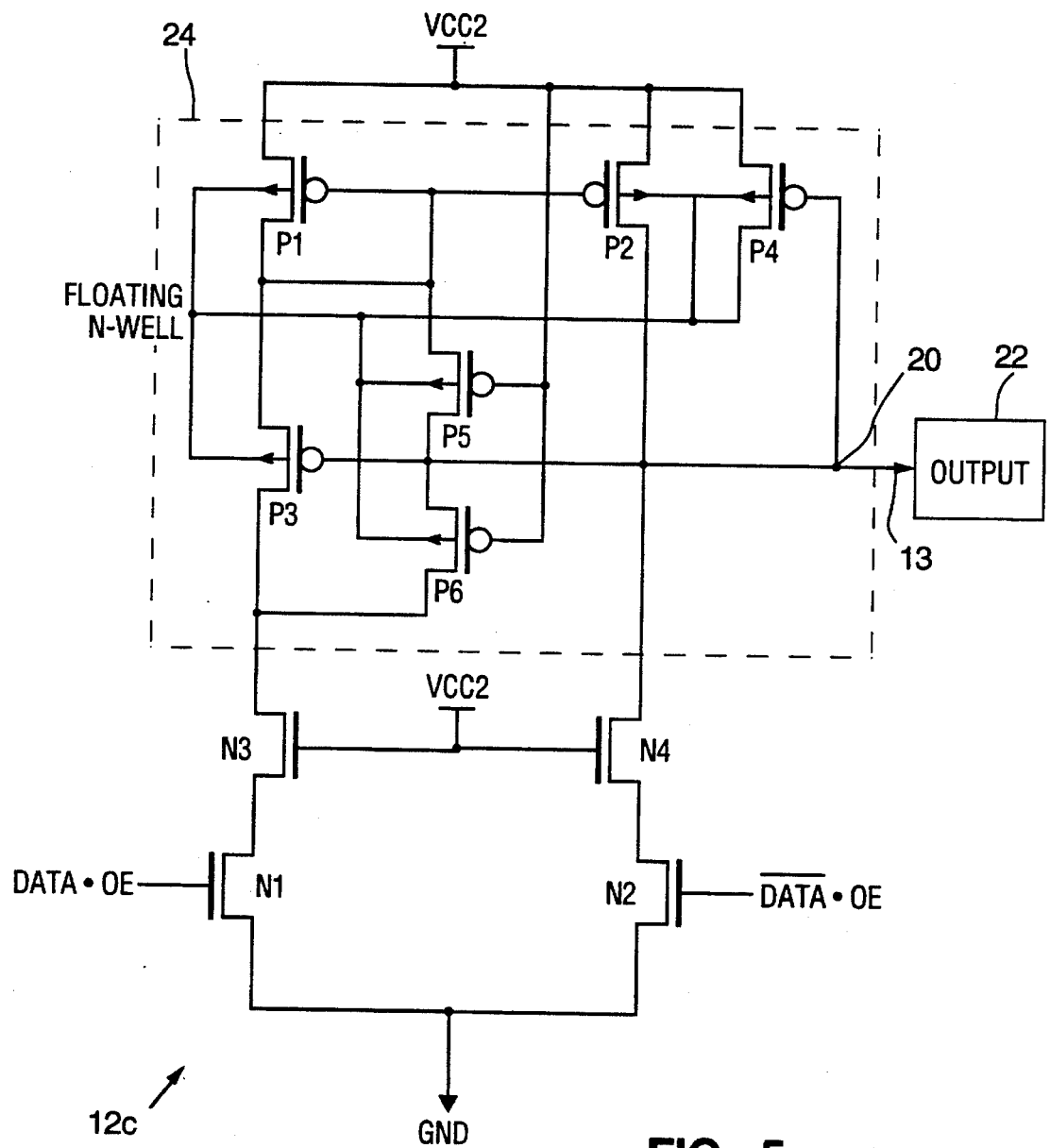
FIG. 5 is a schematic diagram of a low-power, logic signal level converter circuit in accordance with still another embodiment of the present invention.

Referring to FIG. 5, a low-power, logic signal level converter 12c in accordance with another embodiment of the present invention includes the CMOSFET current mirror differential amplifier of FIG. 2A, with some additional components (NMOSFETs N3 and N4, and PMOSFETs P4, P5 and P6) provided some further advantages and benefits. This converter circuit 12c can be used to interface with an output pad 22 experiencing voltage levels Vpad up to Vcc2+BVox (where BVox is the gate oxide breakdown voltage, which must be higher than Vcc2). In other words, the voltage level Vpad experienced by the output pad 22 can be higher than BVox without causing well-leakage current or gate oxide breakdown when the output node 20 is disabled to a high impedance state.

The enhanced protection for the output node 20 of this circuit 12c is achieved by adding NMOSFETs N3 and N4, totem-pole-coupled between NMOSFETs N1 and N2 and PMOSFET P3 and the output node 20, as shown, and by placing the original PMOSFETs P1, P2 and P3, as well as the additional PMOSFETs P4, P5 and P6, in a floating N-well 24 (e.g., within the IC die containing the converter circuit 12c).

When the output enabling signal OE is high, the normal operation of this circuit 12c is similar to that described for the circuit of FIG. 2A. While so enabled, transistors N3 and N4 are turned on (with their gates biased by the power supply voltage Vcc2) and PMOSFETs P5 and P6 are turned off (with their gates biased by the power supply voltage Vcc2). Transistor P4 conducts current when the output signal 13 voltage and the voltage potential of the N-well 24 are lower than the power supply voltage Vcc2.

When the output is disabled, i.e., when the output enabling signal OE is low, the output pad 22 voltage Vpad can go higher than Vcc2. The drain-to-gate voltages of transistors N3 and N4 are then Vpad-Vcc2, while the drain voltages of transistors N1 and N2 are limited to Vcc2-Vth,n (where Vth,n is the NMOSFET threshold voltage). As noted above, all PMOSFETs (P1-P6) are integrated within the same N-well 24 which is tied to Vcc2 through transistor P4 when Vpad is low. However, if Vpad is raised higher than Vcc2, transistor P4 is turned off and the N-well becomes coupled to the output pad 22 through the drain junction diode of transistors P2, P5 and P6. No current flows between Vcc2 and the output pad 22 except the reverse-biased junction diode current at the sources of P1 and P2 (due to the fact that the gate voltages of transistors P1 and P2 follow Vpad since transistor P5 is conductive). Meanwhile, all of the gate-to-source junction voltages of the PMOSFETs are limited to Vpad-Vcc2.

(Further discussion of output driver protection afforded by the use of a floating N-well as discussed above can be found in Daniel W. Dobberpuhl, et al., "A 200-MHz 64-*b* Dual-Issue CMOS Microprocessor," IEEE Journal of Solid-State Circuits, Vol. 27, No. 11, November 1992, pp. 1555–1564.)

It should be understood that various alternatives to the embodiments of the present invention described herein can be employed in practicing the present invention. It is intended that the following claims define the scope of the present invention and that structures and methods within the scope of these claims and their equivalents be covered thereby.

What is claimed is:

1. An apparatus including a logic circuit, said circuit comprising:

an input circuit for receiving an input logic signal which includes first and second logic states with first and second logic transitions and a first logic level difference therebetween;

an output node for providing an output logic signal which corresponds to said input logic signal; and a current mirror circuit, coupled to said input circuit and said output node, for receiving therefrom and providing thereto said input and output logic signals, respectively, wherein said current mirror circuit is nonconductive during said first logic state of said input logic signal.

2. An apparatus as recited in claim 1, wherein said output logic signal includes third and fourth logic states with a second logic level difference therebetween and said second logic level difference is greater than said first logic level difference.

3. An apparatus as recited in claim 1, wherein said current mirror circuit comprises a plurality of PMOSFETs integrated into a floating N-well within a semiconductor die.

4. An apparatus as recited in claim 1, further comprising a logic signal source, coupled to said input circuit, for providing said input logic signal.

5. An apparatus as recited in claim 1, further comprising a signal bus line, coupled to said output node, for receiving and conducting said output logic signal.

6. An apparatus as recited in claim 5, further comprising a logic signal receiver, coupled to said signal bus line, for receiving said output logic signal.

7. An apparatus as recited in claim 1, wherein:

said input circuit is coupled to said output node and includes first and second transistors with on and off states and transition states therebetween, and wherein said first transistor is on and off and said second transistor is off and on in response to said first and second logic states, respectively;

said current mirror circuit includes third and fourth transistors with on and off states for coupling to a power supply to selectively conduct current therefrom, wherein said fourth transistor is on during one of said second transistor transition states as said second transistor transitions from said second transistor on state to said second transistor off state; and further comprising a current control circuit, coupled to said output node and said input and current mirror circuits, which includes a fifth transistor with on and off states for selectively conducting said power supply current via said current mirror circuit to said input circuit, wherein said fifth transistor is on and off in response to said on and off states of said second transistor, respectively.

8. An apparatus including a logic circuit, said circuit comprising:

an input circuit for receiving an input logic signal which includes first and second logic states with first and second logic transitions and a first logic level difference therebetween, an output node for providing an output logic signal which corresponds to said input logic signal, and a current mirror circuit, coupled to said input circuit and said output node, for receiving therefrom and providing thereto said input and output logic signals, respectively, wherein said current mirror circuit is nonconductive during said first logic state of said input logic signal;

wherein:

said input circuit is coupled to said output node and includes first and second transistors with on and off states and transition states therebetween, and wherein said first transistor is on and off and said second transistor is off and on in response to said first and second logic states, respectively, said current mirror circuit includes third and fourth transistors with on and off states for coupling to a power supply to selectively conduct current therefrom, wherein said fourth transistor is on during one of said second transistor transition states as said second transistor transitions from said second transistor on state to said second transistor off state, and further comprising a current control circuit, coupled to said output node and said input and current mirror circuits, which includes a fifth transistor with on and off states for selectively conducting said power supply current via said current mirror circuit to said input circuit, wherein said fifth transistor is on and off in response to said on and off states of said second transistor, respectively; and wherein said input circuit further includes sixth and seventh transistors, and wherein said sixth transistor is totem-pole-coupled to said first and fifth transistors and said seventh transistor is totem-pole-coupled to said second transistor and said output node.

9. A method of providing an apparatus including a logic circuit, said method comprising the steps of:

providing an input circuit for receiving an input logic signal which includes first and second logic states with first and second logic transitions and a first logic level difference therebetween;

providing an output node for providing an output logic signal which corresponds to said input logic signal; and providing a current mirror circuit, coupled to said input circuit and said output node, for receiving therefrom and providing thereto said input and output logic signals, respectively, wherein said current mirror circuit is nonconductive during a time period in which said input logic signal is in said first logic state and said current mirror circuit is providing said output logic signal.

10. A method as recited in claim 9, wherein said output logic signal includes third and fourth logic states with a second logic level difference therebetween and said second logic level difference is greater than said first logic level difference.

11. A method as recited in claim 9, wherein said current mirror circuit comprises a plurality of PMOSFETs integrated into a floating N-well within a semiconductor die.

12. A method as recited in claim 9, further comprising the step of providing a logic signal source, coupled to said input circuit, for providing said input logic signal.

13. A method as recited in claim 9, further comprising the step of providing a signal bus line, coupled to said output node, for receiving and conducting said output logic signal.

14. A method as recited in claim 13, further comprising the step of providing a logic signal receiver, coupled to said signal bus line, for receiving said output logic signal.

15. A method as recited in claim 9, wherein:

said step of providing an input circuit comprises providing first and second transistors coupled to said output node with on and off states and transition states therebetween, wherein said first transistor is on and off and said second transistor is off and on in response to said first and second logic states, respectively;

said step of providing a current mirror circuit comprises providing third and fourth transistors with on and off states for coupling to a power supply for selectively conducting current therefrom, wherein said fourth transistor is on during one of said second transistor transition states as said second transistor transitions from said second transistor on state to said second transistor off state; and further comprising the step of providing a current control circuit, coupled to said output node and said input and current mirror circuits, which includes a fifth transistor with on and off states for selectively conducting said power supply current via said current mirror circuit to said input circuit, wherein said fifth transistor is on and off in response to said on and off states of said second transistor, respectively.

16. A method of providing an apparatus including a logic circuit, said method comprising the steps of:

providing an input circuit for receiving an input logic signal which includes first and second logic states with first and second logic transitions and a first logic level difference therebetween, providing an output node for providing an output logic signal which corresponds to said input logic signal, and providing a current mirror circuit, coupled to said input circuit and said output node, for receiving therefrom and providing thereto said input and output logic signals, respectively, wherein said current mirror circuit is nonconductive during said first logic state of said input logic signal;

wherein:

said step of providing an input circuit comprises providing first and second transistors coupled to said output node with on and off states and transition states therebetween, wherein said first transistor is on and off and said second transistor is off and on in response to said first and second logic states, respectively, said step of providing a current mirror circuit comprises providing third and fourth transistors with on and off states for coupling to a power supply for selectively conducting current therefrom, wherein said fourth transistor is on during one of said second transistor transition states as said second transistor transitions from said second transistor on state to said second transistor off state, and further comprising the step of providing a current control circuit, coupled to said output node and said input and current mirror circuits, which includes a fifth transistor with on and off states for selectively conducting said power supply current via said current mirror circuit to said input circuit, wherein said fifth transistor is on and off in response to said on and off states of said second transistor, respectively; and wherein said input circuit further includes sixth and seventh transistors, and wherein said sixth transistor is totem-pole-coupled to said first and fifth transistors and said seventh transistor is totem-pole-coupled to said second transistor and said output node.

17. A method of providing a logic signal, said method comprising the steps of:

receiving an input logic signal including first and second logic states with first and second logic transitions and a first logic including second logic transitions and a first logic level difference therebetween; and providing during said first logic state of said input logic signal an output logic signal corresponding to said input logic signal with a current mirror circuit which is nonconductive.

18. A method as recited in claim 17, wherein said step of providing an output logic signal comprises providing an output logic signal which includes third and fourth logic states with a second logic level difference therebetween, wherein said second logic level difference is greater than said first logic level difference.

19. A method as recited in claim 17, wherein said step of providing an output logic signal comprises turning on one of a plurality of PMOSFETs integrated into a floating N-well within a semiconductor die during said one of said input logic signal logic transitions.

20. A method as recited in claim 17, further comprising the step of providing said input logic signal.

21. A method as recited in claim 17, further comprising the step of conducting said output logic signal on a signal bus line.

22. A method as recited in claim 21, further comprising the step of receiving said output logic signal via said signal bus line.

23. A method as recited in claim 17, wherein:

said step of receiving an input logic signal comprises turning a first transistor on and off and a second transistor off and on in response to said first and second logic states, respectively, with transition states between said on and off states of said first and second transistors;

said step of providing an output logic signal comprises selectively conducting current from a power supply with a third transistor and turning on a fourth transistor during one of said second transistor transition states as said second transistor transitions from said second transistor on state to said second transistor off state; and further comprising the step of selectively conducting said power supply current via said third transistor to said first transistor with a fifth transistor which is on and off in response to said on and off states of said second transistor, respectively.

24. A method of providing a logic signal, said method comprising the steps of:

receiving an input logic signal including first and second logic states with first and second logic transitions and a first logic level difference therebetween, and providing an output logic signal corresponding to said input logic signal with a current mirror circuit which is nonconductive during said first logic state of said input logic signal;

wherein:

said step of receiving an input logic signal comprises turning a first transistor on and off and a second transistor off and on in response to said first and second logic states, respectively, with transition states between said on and off states of said first and second transistors, said step of providing an output logic signal comprises selectively conducting current from a power supply with a third transistor and turning on a fourth transistor during one of said second transistor transition states as said second transistor transitions from said second transistor on state to said second transistor off state, and further comprising the step of selectively conducting said power supply current via said third transistor to said first transistor with a fifth transistor which is on and off in response to said on and off states of said second transistor, respectively; and further comprising the steps of turning on a sixth transistor which is totem-pole-coupled to said first and fifth transistors and turning on a seventh transistor which is totem-pole-coupled to said second transistor and said output node.

\* \* \* \* \*

UNITED STATES PATENT AND TRADEMARK OFFICE
CERTIFICATE OF CORRECTION

PATENT NO. : 5,469,080
DATED : NOVEMBER 21, 1995
INVENTOR(S) : ILHUN SON

It is certified that error appears in the above-indentified patent and that said Letters Patent is hereby corrected as shown below:

In Col. 6, line 22, please delete "said first logic state of said input logic signal" and replace with --a time period in which said input logic signal is in said first logic state and said current mirror circuit is providing said output logic signal--.

In Col. 9, lines 6 and 7, please delete "including second logic transitions and a first logic".

Signed and Sealed this

Fifth Day of March, 1996

*Attest:*

BRUCE LEHMAN

*Attesting Officer*     Commissioner of Patents and Trademarks